United States Patent
Milne et al.

(10) Patent No.: US 6,907,584 B1
(45) Date of Patent: Jun. 14, 2005

(54) METHOD AND APPARATUS FOR PROVIDING AN INTERFACE TO AN ELECTRONIC DESIGN OF AN INTEGRATED CIRCUIT

(75) Inventors: Roger B. Milne, Boulder, CO (US); Jeffrey D. Stroomer, Lafayette, CO (US)

(73) Assignee: Xilinx, Inc., San Jose, CA (US)

( * ) Notice: Subject to any disclaimer, the term of this patent is extended or adjusted under 35 U.S.C. 154(b) by 115 days.

(21) Appl. No.: 10/388,728

(22) Filed: Mar. 14, 2003

(51) Int. Cl.[7] .................................................. G06F 17/50
(52) U.S. Cl. .................................................. 716/1; 716/3
(58) Field of Search ........................................ 716/1, 3

(56) References Cited

U.S. PATENT DOCUMENTS

| | | | | |
|---|---|---|---|---|
| 5,101,491 A | * | 3/1992 | Katzeff ........................ | 703/22 |
| 6,505,338 B1 | * | 1/2003 | Suzuki et al. ................ | 716/18 |
| 6,536,031 B2 | * | 3/2003 | Ito et al. ...................... | 716/18 |
| 6,539,537 B1 | * | 3/2003 | Nakamura et al. ........... | 716/18 |
| 6,687,894 B2 | * | 2/2004 | Ohnishi et al. .............. | 716/18 |
| 2002/0083420 A1 | * | 6/2002 | Zammit et al. ............. | 717/135 |
| 2003/0115554 A1 | * | 6/2003 | Ara et al. .................... | 716/1 |

* cited by examiner

*Primary Examiner*—Vuthe Siek
*Assistant Examiner*—Sun James Lin
(74) *Attorney, Agent, or Firm*—Moser, Patterson & Sheridan; LeRoy D. Maunu (57) ABSTRACT

Method, apparatus, and computer readable medium for producing an interface description for an electronic design of an integrated circuit is described. By example, the electronic design includes a plurality of circuit descriptions representing the behavior of circuit elements. One or more circuit descriptions from the electronic design are selected to produce interface description. The one or more selected circuit descriptions include a subset of the plurality of circuit descriptions of the electronic design. A processor for modifying the electronic design is obtained. The electronic design is then processed using the processor with the interface description as parametric input.

23 Claims, 5 Drawing Sheets

METHOD AND APPARATUS FOR PROVIDING AN INTERFACE TO AN ELECTRONIC DESIGN OF AN INTEGRATED CIRCUIT

REFERENCE TO A COMPUTER PROGRAM LISTING APPENDIX

This application includes a computer program listing appendix on a single compact disc, the contents of which are incorporated herein by reference. The compact disc contains a first 45KB file entitled "INTRFACE.TXT", a second 7KB file entitled "WBUILDER.TXT", and a third 4KB file entitled "WRAPPER.TXT", all of which were created on Feb. 28, 2003. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

One or more aspects of the invention relate generally to electronic design systems for integrated circuits and, more particularly, to providing an interface that describes an electronic design of an integrated circuit.

BACKGROUND OF THE INVENTION

Hardware Description Languages (HDLs), such as the Very high-speed integrated circuit Hardware Description Language (VHDL) or Verilog are text-based approaches to digital logic design through behavioral and/or structural description of design elements. HDL can be used to design: (1) a programmable logic device (PLD), such as a field programmable gate array (FPGA) or complex programmable logic device (CPLD); (2) a mask programmable device, such as a hardwired programmable gate array (PGA), application-specific standard product (ASSP) or application specific integrated circuit (ASIC); (3) a system formed from selected electronic hardware components; or (4) any other electronic device. The HDL-based approach to design requires the user to describe the behavior of a system, which can then be simulated to determine whether the design will function as desired. The design is then synthesized to create a logical network list ("netlist") that can be implemented within a particular device.

Many tools exist that allow electronic designs of integrated circuits (ICs) to be assembled, simulated, debugged, and translated into hardware. In general, an IC modeling system allows an IC design to be described and simulated with a gate-level abstraction. For example, a designer produces an electronic representation of the IC design using a modeling system by connecting and arranging schematic representations of circuit elements on a computer display, then uses the modeling system to translate the electronic IC design to a lower level HDL description, such as at a transistor or even lower level, for simulation or realization in hardware. For example, a simulator may accept transistor-level abstraction to simulate the electronic IC design, or place and route tools may accept a transistor-level HDL description of the electronic IC design to produce a configuration bitstream.

In some instances, an electronic IC design created within a modeling system must be tailored at a later stage of an overall design process. For example, a design developed within a modeling system may be tailored for incorporation within, or connection to, another IC design, most if not all of which is external to the modeling system. A modeling system may only support unidirectional ports, but incorporating the modeling system design in a larger design may require bidirectional ports. A modeling system may be used to process particular components of a circuit board, the remaining components being processed outside of the modeling system.

Conventionally, the results produced by a modeling system are tailored by hand, or by software that parses HDL. Tailoring by hand is tedious and error-prone, and HDL parsers are complicated and difficult to write. Furthermore, some of the information needed to tailor results (e.g., the date on which the design was produced, the collection of tools used to make the design, the names of the clock ports) may not be available in the HDL representation of the design produced by the modeling system.

Therefore, there exists a need in the art for an interface to an IC design produced by a modeling system. In particular, there exists a need for an interface that facilitates software modification of the IC design without requiring parsing an HDL representation.

SUMMARY OF THE INVENTION

Method, apparatus, and computer readable medium for producing an interface to an electronic design of an integrated circuit are described. In an embodiment in accordance with one or more aspects of the invention, the electronic design includes a plurality of circuit descriptions representing the behavior of circuit elements. One or more circuit descriptions from the electronic design are selected to produce an interface description. The one or more selected circuit descriptions include a subset of the plurality of circuit descriptions of the electronic design. A processor for modifying the electronic design is obtained. The electronic design is then processed using the processor with the interface description as parametric input.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method and apparatus for providing an interface to an electronic design of an integrated circuit is described. One or more aspects of the invention are described with respect to providing an interface between an integrated circuit (IC) design generated using a modeling system and another IC design generated outside or external to the modeling system. Those skilled in the art, however, will appreciate that the invention may be used to provide other types of interfaces to an IC design produced by a modeling system that may be used to modify the IC design.

Figure 1:
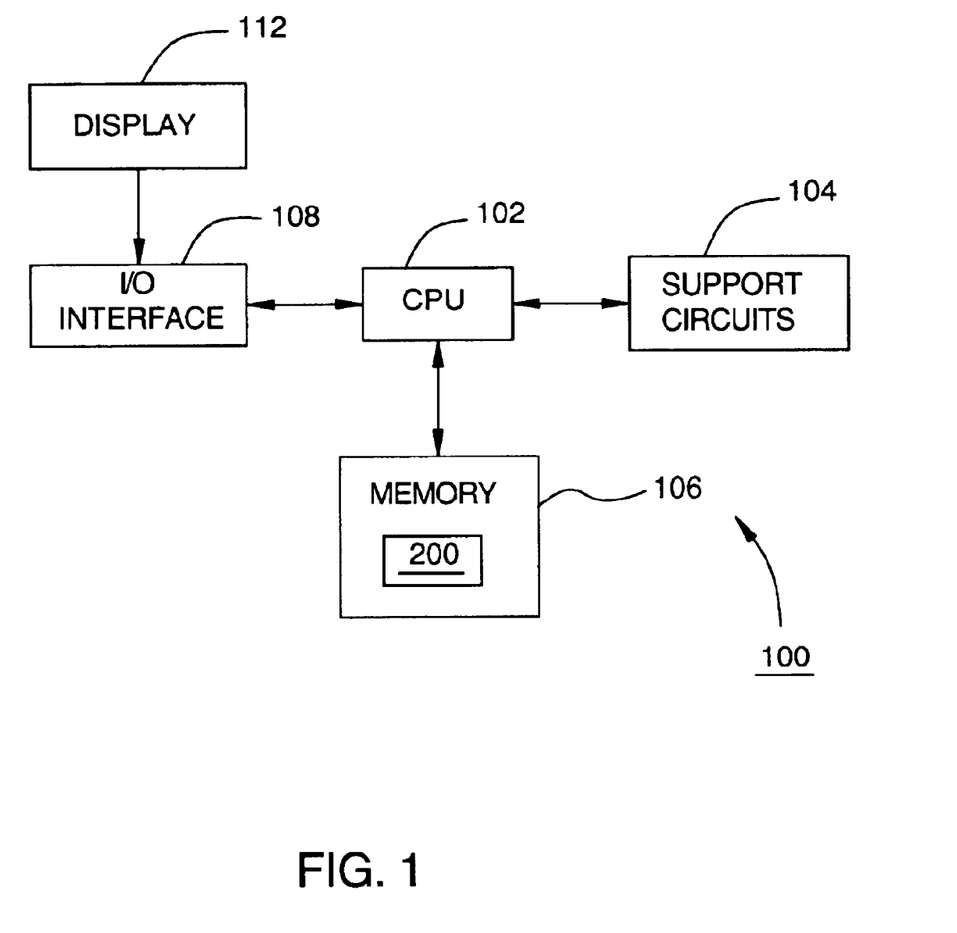
FIG. 1 depicts a block diagram showing an exemplary embodiment of a computer system suitable for implementing processes and methods in accordance with one or more aspects of the invention.

FIG. 1 depicts a block diagram showing an exemplary embodiment of a computer system 100 suitable for implementing processes and methods in accordance with one or more aspects of the invention. Computer system 100 includes a central processing unit (CPU) 102, memory 106, a variety of support circuits 104, and an I/O interface 108. CPU 102 may be any type of microprocessor known in the art. Support circuits 104 for CPU 102 include conventional cache, power supplies, clock circuits, data registers, I/O interfaces, and the like. I/O interface 108 may be directly coupled to memory 106 or coupled through CPU 102, and may be coupled to a conventional keyboard, network, mouse, printer, and interface circuitry adapted to receive and transmit data, such as data files and the like. I/O interface 108 may be coupled to a display 112.

Memory 106 may store all or portions of one or more programs or data to implement the processes and methods of the invention. Although exemplary embodiments of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as application specific integrated circuits (ASICs).

Computer system 100 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in memory 106. Memory 106 may include one or more of the following: random access memory, read only memory, magneto-resistive read/write memory, optical read/write memory, cache memory, magnetic read/write memory, and the like, as well as signal-bearing media as described below. Memory 106 may store all or a portion of modeling system 200 of FIG. 2.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-RAM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

Figure 2:
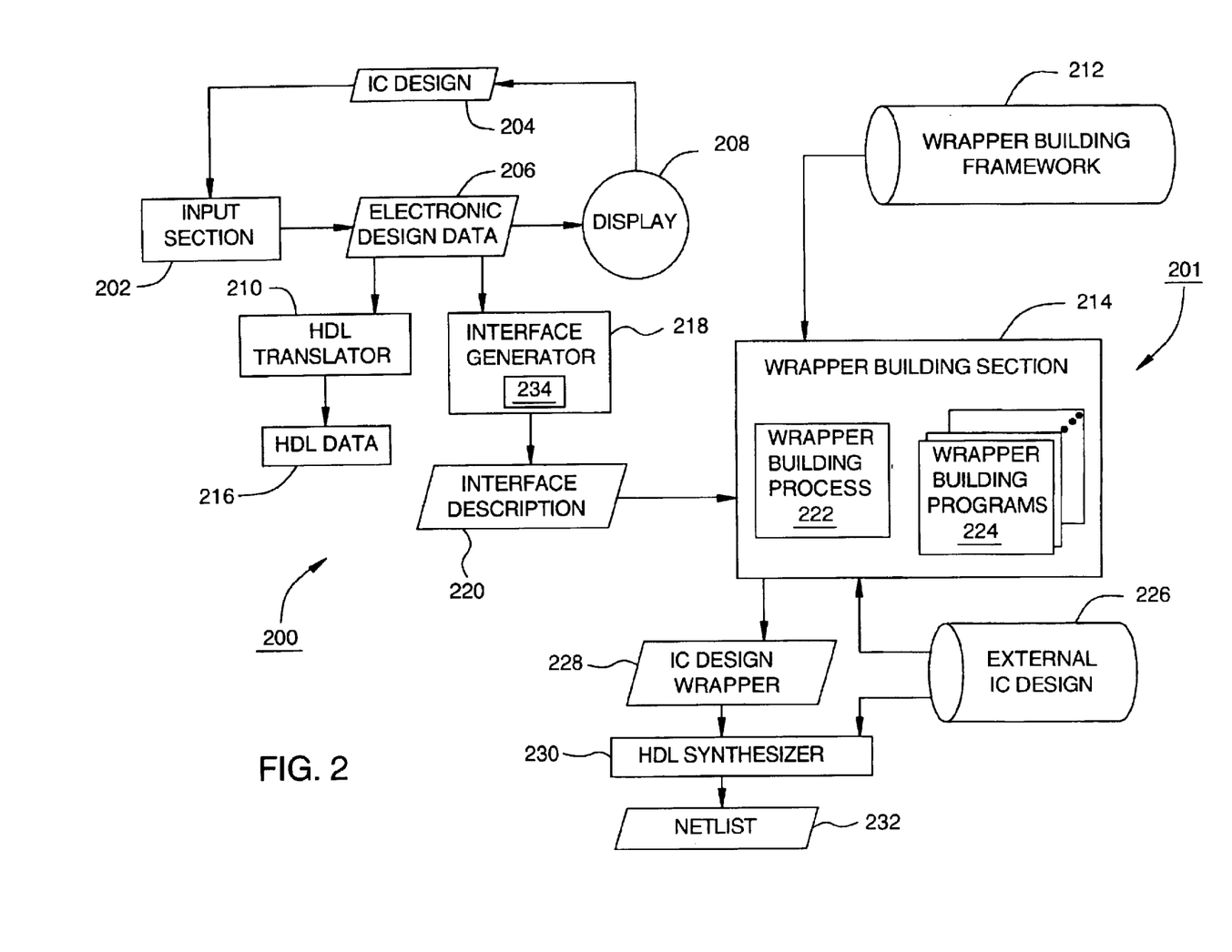
FIG. 2 depicts a high-level block diagram showing an exemplary embodiment of an integrated circuit modeling system coupled to an integrated circuit processing system in accordance with one or more aspects of the invention.

FIG. 2 depicts a high-level block diagram showing an exemplary embodiment of an integrated circuit modeling system 200 coupled to an integrated circuit design processing system 201 in accordance with one or more aspects of the invention. Modeling system 200 includes an input section 202, a display 208, an HDL translator 210, and an interface generator 218. IC design processing system 201 includes an interface processing section ("wrapper building section" 214) and an HDL synthesizer 230. In an embodiment, modeling system 200 and IC design processing system 201 are implemented using computer system 100 of FIG. 1. Notably, input section 202, HDL translator 210, interface generator 218, wrapper building section 214, and HDL synthesizer 230 may be all or portions of one or more programs stored within memory 106 and executed by CPU 102.

Figure 3:
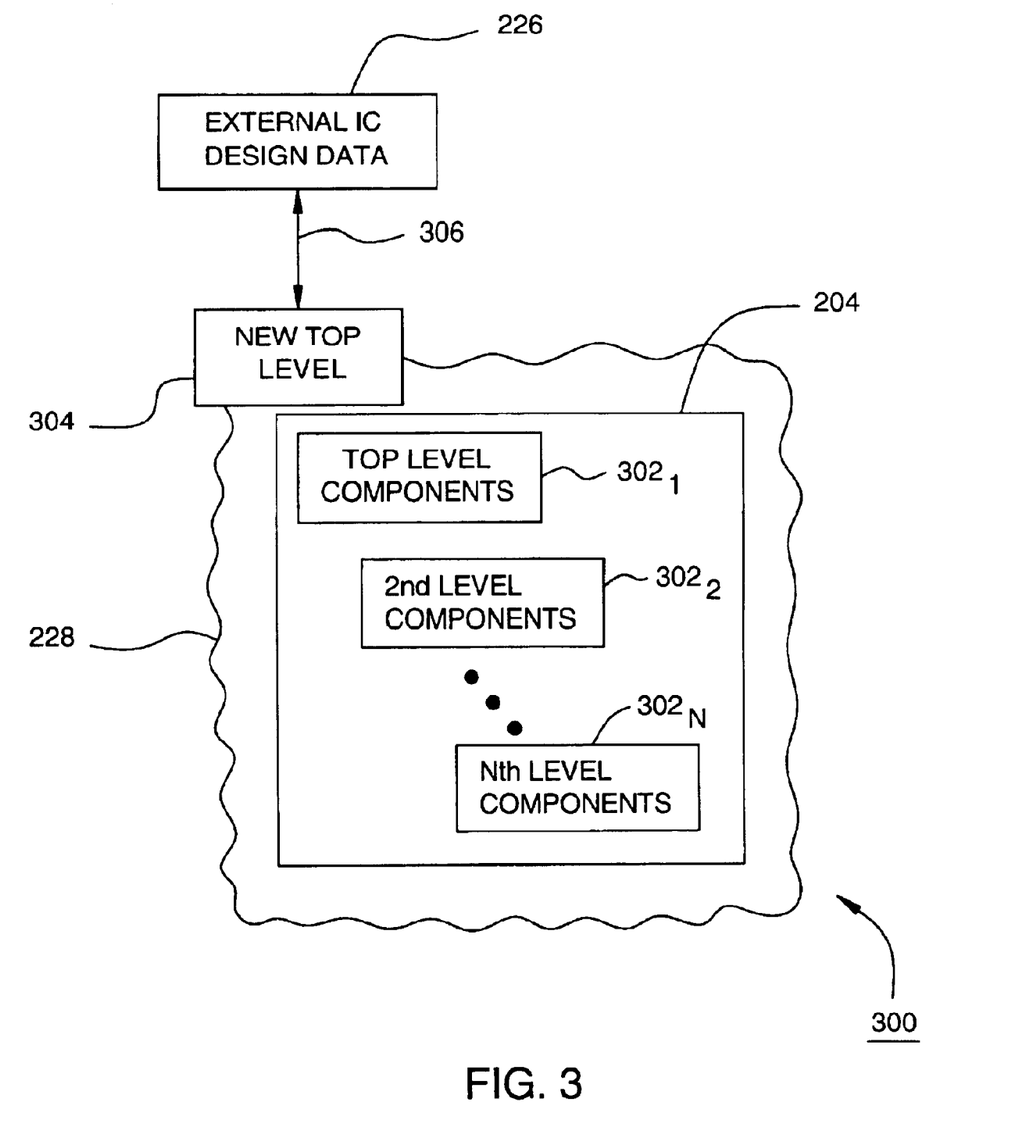
FIG. 3 depicts a block diagram showing an exemplary embodiment of an IC design in accordance with one or more aspects of the invention.

FIG. 3 depicts a block diagram showing an exemplary embodiment of an IC design 300 in accordance with one or more aspects of the invention. IC design 300 illustratively includes a section processed by modeling system 200 ("IC design" 204) and a section processed by IC design processing system 201 ("external IC design" 226). External IC design 226 includes sections of IC design 300 that, for one or more reasons, are not implemented within modeling system 200. For example, external IC design 226 may include features that are not supported by modeling system 200.

IC design 204 illustratively includes N levels of circuit components, or circuit elements, ("components" $302_1$ through $302_N$, where N is an integer greater than zero). For example, top level components $302_1$ may be the highest level circuit components of IC design 204, second level components $302_2$ may be circuit sub-components of each of the circuit components in top level components $302_1$, and so on. In an embodiment, an IC design interface ("IC design wrapper" 228) provides an interface 306 between IC design 204 and external IC design 226. IC design wrapper 228 includes a new top level 304 that "wraps" IC design 204 and connects IC design 204 with external IC design 226.

IC design 204 is input, such as at a schematic or logic level, to modeling system 200 using input section 202 and display 208. Input section 202 produces electronic design data 206 that includes an electronic representation of IC design 204. Electronic design data 206 may be schematically represented on display 208. In general, electronic design data 206 includes a plurality of abstractions or circuit descriptions that represent the behavior of circuit components or elements of IC design 204. HDL translator 210 receives electronic design data 206 and produces HDL data 216, namely, an HDL representation of IC design 204.

For example, System Generator for DSP, commercially available from Xilinx, Inc., is a modeling system that produces an electronic representation of an IC design that includes "blocks", "ports", and "nets". Blocks, or logic blocks, represent sections, having components, of IC design 204. Ports represent inputs and outputs of blocks, and nets, or networks, represent connections between various ports of various blocks. The blocks, ports, and nets of electronic design data 206 are then translated into HDL in a well-known manner. As understood by those skilled in the art, modeling systems may employ other types of circuit descriptions to represent an IC design in addition to, or in place of, the above-described blocks, ports, and nets.

Interface generator 218 also receives electronic design data 206. Interface generator 218 executes a process 234 for producing interface description 220. Process 234 is discussed in more detail below. Interface description 220 includes information related to one or more circuit descriptions of electronic design data 206, where the one or more circuit descriptions are a subset of the total amount of circuit descriptions within electronic design data 206. For example, interface description 220 may include information related to top level components $302_1$ and second level components $302_2$ of IC design 204. Interface description 220 thus functions as a "synopsis" of IC design 204, thereby obviating the need to process electronic design data 206 or HDL data 216 in their entireties within IC design processing section 201.

Wrapper building section 214 receives interface description 220 and produces IC design wrapper 228. Responsive to external IC design 226, wrapper building section 214 is used to produce one or more interface processors ("wrapper builder programs" 224). Wrapper building section 214 executes an interface production process ("wrapper building process" 222) to produce IC design wrapper 228. Notably, wrapper building section 214 executes one or more of wrapper builder programs 224 with interface description 220 as parametric input to produce IC design wrapper 228. IC design wrapper 228 is output as HDL. Wrapper building process 222 is described in more detail below.

Wrapper builder programs 224 are software written using an interpreted language, such as Python, Perl, or Java, or a compiled language, such as C or C++, or other interpreted or compiled languages known in the art. Wrapper builder programs 224 use information relating to external IC design 226 to produce an interface thereto. Notably, wrapper builder programs 224 create circuit descriptions, such as new top level 304, that provide an interface between external IC design 226 and IC design 204 by way of IC design wrapper 228.

In an embodiment, wrapper builder programs 224 are produced using an interface processing framework ("wrapper building framework" 212). wrapper building framework 212 includes program code for facilitating the importation of information from interface description 220, the creation of circuit descriptions representing circuit components, and the connections of circuit components. For example, wrapper building framework 212 may include a collection of Java classes denoted "Netlist", "Block", "Port", and "Net". The netlist class may be used to instantiate data objects that include data structures and mechanisms for processing interface description 220. The block class may be used to instantiate data objects that include data structures and mechanisms for representing circuit components. The port class may be used to instantiate data objects that include data structures and mechanisms for representing inputs and outputs of block data objects. The net class may be used to instantiate data objects that include data structures and mechanisms for representing connections between various port objects of various block objects.

HDL synthesizer 230 receives IC design wrapper 228 along with external IC design 226. HDL synthesizer 230 synthesizes HDL code to create a netlist 232 that may be implemented within hardware with placement and routing. The HDL synthesis process is well-known in the art.

Figure 4:
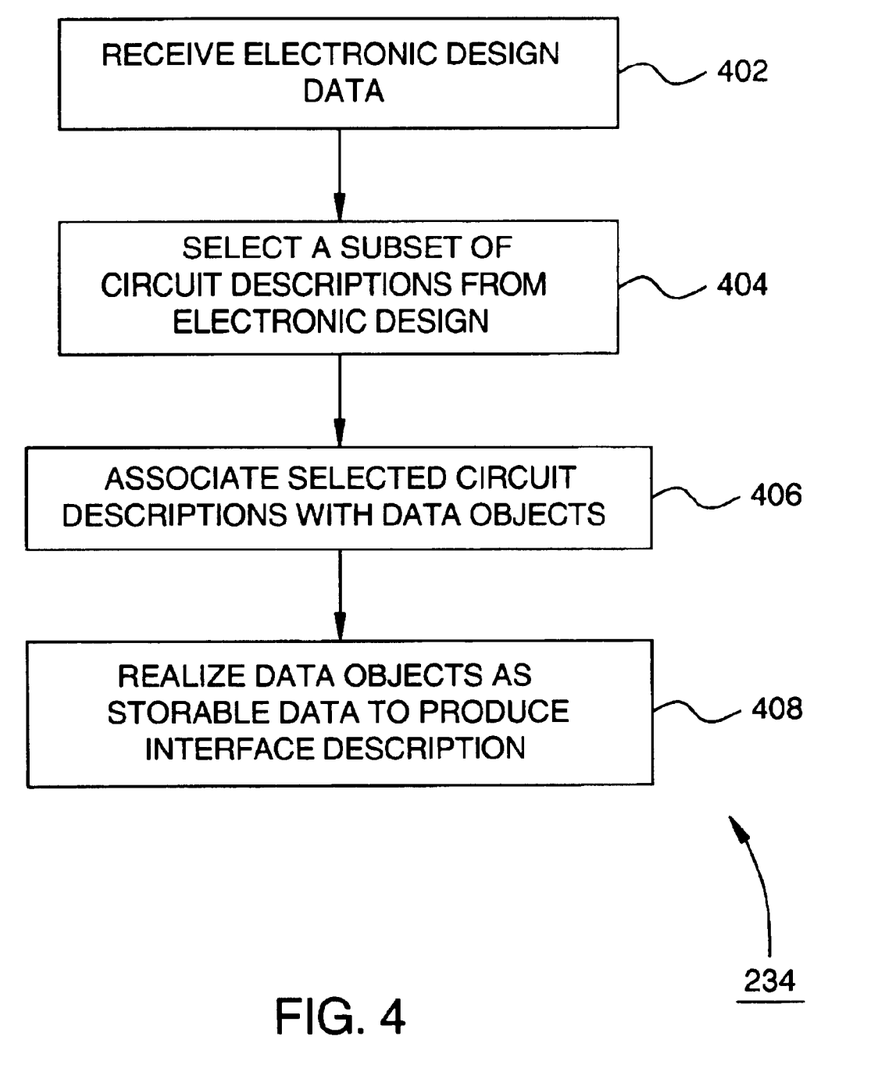
FIG. 4 depicts a flow diagram showing an exemplary embodiment of a process for generating an interface description from an electronic IC design produced by a modeling system in accordance with one or more aspects of the invention.

FIG. 4 depicts a flow diagram showing an exemplary embodiment of a process 234 for generating an interface description from an electronic IC design produced by a modeling system in accordance with one or more aspects of the invention. Process 234 may be understood with simultaneous reference to FIGS. 2 and 3. In an embodiment, process 234 is implemented using computer system 100 of FIG. 1. Notably, all or portions of one or more programs of process 234 may be stored within memory 106 and executed by CPU 102.

Process 234 begins at step 402, where electronic design data 206 are received from modeling system 200. At step 404, one or more circuit descriptions are selected from the electronic design data 206 to provide interface description 220. The one or more selected circuit descriptions are a subset of the total number of circuit descriptions within electronic design data 206. For example, the selected circuit descriptions of step 404 may correspond to top-level components $302_1$ and second level components $302_2$. This may include, for example, blocks, ports, and nets corresponding to both top level components $302_1$ and second level components $302_2$, attributes related to such blocks, ports, and nets, and global attributes related to IC design 204.

At step 406, selected circuit descriptions of step 404 are associated with data objects that correspond with wrapper building framework 212. For example, the selected circuit descriptions of step 404 may be associated with block, port, or net data objects described above. At step 408, the data objects of step 406 are realized as storable data to produce interface description 220. For example, the data objects of step 406 may be realized as program code that, when executed, creates blocks, ports, and nets corresponding to the selected circuit descriptions of step 404. In this example, the data objects of step 406 may be instantiated using the Python netlist class of wrapper building framework 212. In another example, the data objects of step 406 may be realized using Java, and stored in binary form using the well-known Java serialization mechanism. An ASCII representation of an exemplary interface is shown in the file "INTRFACE.TXT" of the computer program listing appendix.

Figure 5:
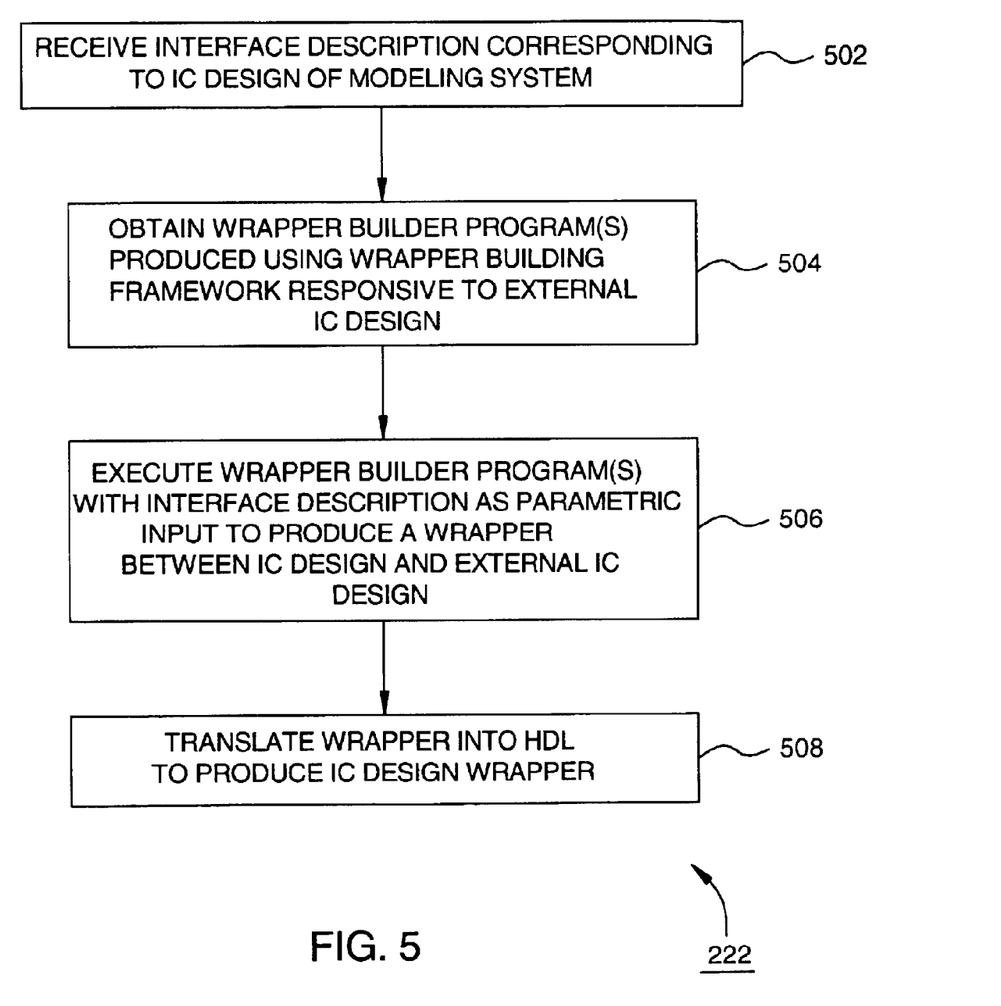
FIG. 5 depicts a flow diagram showing an exemplary embodiment of a process for producing an interface to an electronic IC design produced by a modeling system in accordance with one or more aspects of the invention.

FIG. 5 depicts a flow diagram showing an exemplary embodiment of a process 222 for producing an interface to an electronic IC design produced by a modeling system in accordance with one or more aspects of the invention. Process 222 may be understood with simultaneous reference to FIGS. 2 and 3. In an embodiment, process 222 is implemented using computer system 100 of FIG. 1. Notably, all or portions of one or more programs of process 222 may be stored within memory 106 and executed by CPU 102.

Process 222 begins at step 502, where interface description corresponding to IC design 204 is received from modeling system 200. At step 504, one or more wrapper builder programs 224 are obtained, where wrapper builder programs 224 are produced using wrapper building framework 212 responsive to external IC design 226. An exemplary wrapper builder program written using Java is shown in the file "WBUILDER.TXT"of the computer program listing appendix. At step 506, wrapper builder programs 224 are executed with interface description 220 as parametric input to produce a wrapper between IC design 204 and external IC design 226. At step 508, the wrapper of step 506 is translated into HDL to produce IC design wrapper 228. An exemplary wrapper in VHDL format is shown in the file "WRAPPER.TXT" of the computer program listing appendix. The wrapper shown in "WRAPPER.TXT" is created by executing the wrapper builder program shown in "WBUILDER.TXT" with the interface shown in the file "INTRFACE.TXT" as parametric input.

For clarity, aspects in accordance with the invention have been described with respect to producing a wrapper that provides an interface between an electronic IC design produced by a modeling system and an external electronic IC design. In general, however, the interface description 220 produced by modeling system 200 may be used not only to build wrappers, but also by any process that modifies IC design 204 in accordance with information internal or external to modeling system 200. For example, a process might use the interface description to discard the highest level of HDL hierarchy produced by modeling system 200, substituting a new level of HDL hierarchy in which formerly hidden ports from IC design 204 are exposed. In another example, a process might use the interface description to generate "timing constraints" or "location constraints" related to IC design 204. Such constraints can be used by routing and placement tools to improve placement of circuit elements and to make best use of routing resources when realizing IC design 204 in hardware. Those skilled in the art may readily devise other types of processes for modifying an IC design produced by a modeling system that employ an interface description in accordance with one or more aspects of the invention.

Method, apparatus, and computer readable medium for producing an interface to an electronic design of an integrated circuit has been described. One or more aspects of the invention relate to producing, an interface description corresponding to an IC design input to an electronic design tool. The interface description includes circuit descriptions corresponding to a subset of relevant circuit components within the IC design. Processors related to external information may be produced using an interface processing framework that provides the capability to process the interface description. The interface processors produce an interface to the IC design using the interface description as parametric input. By using the interface description produced, the processors do not have to process the entire electronic design produced by the modeling system, and there is no need for the processors to parse an HDL description of any portion of the design produced by the modeling system.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method of producing an interface to an electronic design of an integrated circuit, the electronic design having a plurality of circuit descriptions representing behavior of circuit elements, the method comprising:

selecting one or more circuit descriptions from the electronic design to produce an interface description, the one or more selected circuit descriptions including a subset of the plurality of circuit descriptions;

providing an electronic design tool for modeling the electronic design, the one or more circuit descriptions representing a portion of circuitry for the electronic design;

obtaining a processor for modifying the electronic design, wherein the processor is associated with another electronic design of an integrated circuit, the another electronic design being modeled external to the electronic design tool; and processing the electronic design using the processor with the interface description as parametric input.

2. The method of claim 1, wherein the selecting comprises realizing data objects associated with the one or more circuit descriptions as storable data to produce the interface description.

3. The method of claim 2, wherein the interface description is realized as executable program code.

4. The method of claim 2, wherein the interface description is realized in binary form.

5. The method of claim 1, wherein obtaining comprises:

providing an interface processing framework; and producing the processor using the interface processing framework.

6. The method of claim 1, further comprising translating the electronic design processed into hardware description language.

7. A method of providing a wrapper for a first electronic design of an integrated circuit, the wrapper providing an interface to a second electronic design of the integrated circuit, the method comprising:

selecting one or more circuit descriptions from the first electronic design to provide an interface description, the one or more circuit descriptions representing a subset of circuitry of the first electronic design;

obtaining a wrapper builder related to the second electronic design; and processing the first electronic design using the wrapper builder with the interface description as parametric input to produce the wrapper.

8. The method of claim 7, further comprising providing an electronic design tool for modeling the first electronic design, the second electronic design being modeled external to the electronic design tool.

9. The method of claim 7, wherein the selecting comprises realizing data objects associated with the one or more circuit descriptions as storable data to produce the interface description.

10. The method of claim 7, wherein the obtaining comprises:

providing a wrapper building framework; and producing the wrapper builder using the wrapper building framework responsive to the second electronic design.

11. The method of claim 7, further comprising translating the wrapper into hardware description language.

12. A computer readable medium having stored thereon instructions that, when executed by a processor, cause the processor to perform a method of producing an interface description for an electronic design of an integrated circuit, the electronic design having a plurality of circuit descriptions representing behavior of circuit elements, the method comprising:

selecting one or more circuit descriptions from the electronic design to produce an interface description, the one or more circuit descriptions including a subset of the plurality of circuit descriptions;

providing an electronic design tool for modeling the electronic design, the one or more circuit descriptions representing a portion of circuitry for the electronic design;

obtaining a processor for modifying the electronic design, wherein the processor is associated with another electronic design of an integrated circuit, the another electronic design being modeled external to the electronic design tool; and processing the electronic design using the processor with the interface description as parametric input.

13. An apparatus for producing an interface to an electronic design of an integrated circuit, the electronic design having a plurality of circuit descriptions representing behavior of circuit elements, the apparatus comprising:

means for selecting one or more circuit descriptions from the electronic design to produce an interface description, the one or more circuit descriptions including a subset of the plurality of circuit descriptions;

means for providing an electronic design tool for modeling the electronic design, the one or more circuit descriptions representing a portion of circuitry for the electronic design;

means for obtaining a processor for modifying the electronic design, wherein the processor is associated with another electronic design of an integrated circuit, the another electronic design being modeled external to the electronic design tool; and means for processing the electronic design using the processor with the interface description as parametric input.

14. A system for producing an interface to an electronic design of an integrated circuit, the electronic design having a plurality of circuit descriptions representing behavior of circuit elements, the system comprising:

a processing unit having access to one or more storage devices;

at least a portion of the one or more storage devices having a plurality of circuit descriptions representing behavior of circuit elements of the electronic design, and one or more processors for modifying the electronic design;

at least another portion of the one or more storage devices having a program product configured to:

select one or more circuit descriptions from the electronic design to produce an interface description, the one or more circuit descriptions including a subset of the plurality of circuit descriptions;

provide an electronic design tool for modeling the electronic design, the one or more circuit descriptions representing a portion of circuitry for the electronic design;

obtain a processor of the one or more processors, wherein the processor is associated with another electronic design of an integrated circuit, the another electronic design being modeled external to the electronic design tool; and process the electronic design using the processor obtained with the interface description as parametric input.

15. A system for producing an interface description for an electronic design of an integrated circuit, the electronic design having a plurality of circuit descriptions representing behavior of circuit elements, the system comprising:

a input section for providing electronic design data responsive to the electronic design;

an electronic design tool for modeling the electronic design, the one or more circuit descriptions representing a portion of circuitry for the electronic design;

an interface generator for providing an interface description, the interface description including one or more circuit descriptions from the electronic design data, the one or more circuit descriptions including a subset of the plurality of circuit descriptions;

a processing section for obtaining a processor for modifying the electronic design and processing the electronic design using the processor with the interface description as parametric input, wherein the processor is associated with another electronic design of an integrated circuit, the another electronic design being modeled external to the electronic design tool.

16. A method for generating an interface specification between a first electronic circuit design and a second electronic circuit design, comprising:

selecting a subset of circuit design information from the first circuit design as interface objects of the first circuit design;

generating a wrapper-building program from input of a set of interface classes and the second circuit design; and executing the wrapper-building program with the interface objects as input, and generating a design wrapper that specifies the interface specification in response to execution of the wrapper-building program.

17. The method of claim 16, wherein the interface specification in set forth in a hardware description language (HDL).

18. The method of claim 17, further comprising synthesizing the HDL interface specification.

19. The method of claim 16, wherein the interface objects from the first circuit design include blocks, ports, and nets from a modeling system.

20. The method of claim 19, wherein the selecting step comprises:

selecting a subset of circuit description information from the first circuit design; and associating the subset of circuit description information with interface objects.

21. The method of claim 20, wherein the interface classes include a block class, a port class, and a net class; and an object of the block class instantiates data representative of a circuit component, an object of the port class instantiates data representative of inputs and outputs of a block object, and a net object instantiates data representative of connections between port objects.

22. An apparatus for generating an interface specification between a first electronic circuit design and a second electronic circuit design, comprising:

means for selecting a subset of circuit design information from the first circuit design as interface objects of the first circuit design;

means for generating a wrapper-building program from input of a set of interface classes and the second circuit design; and means for executing the wrapper-building program with the interface objects as input, and generating a design wrapper that specifies the interface specification in response to execution of the wrapper-building program.

23. A system for generating an interface specification between a first electronic circuit design and a second electronic circuit design, comprising:

a modeling system adapted to select a subset of circuit design information from the first circuit design as interface objects of the first circuit design; and an interface builder coupled to the modeling system, the interface builder adapted to generate a wrapper-building program from input of a set of interface classes and the second circuit design, and execute the wrapper-building program with the interface objects as input, and generate a design wrapper that specifies the interface specification in response to execution of the wrapper-building program.

* * * * *